United States Patent
Liu et al.

(10) Patent No.: US 7,090,889 B2
(45) Date of Patent: Aug. 15, 2006

(54) BORIDE THIN FILMS ON SILICON

(75) Inventors: Zi-Kui Liu, State College, PA (US); Zhi-Jie Liu, State College, PA (US); Xiaoxing Xi, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 10/784,899

(22) Filed: Feb. 24, 2004

(65) Prior Publication Data
US 2004/0234785 A1 Nov. 25, 2004

Related U.S. Application Data

(60) Provisional application No. 60/450,321, filed on Feb. 28, 2003.

(51) Int. Cl.
*B05D 5/12* (2006.01)
*H01L 39/24* (2006.01)
*C23C 16/00* (2006.01)

(52) U.S. Cl. .................. 427/62; 427/255.28; 29/599; 505/473; 505/732

(58) Field of Classification Search .............. 427/62, 427/255.28; 29/599; 204/192.24; 505/470, 505/473, 729, 732
See application file for complete search history.

(56) References Cited

U.S. PATENT DOCUMENTS 3,791,852 A 2/1974 Bunshah
3,949,119 A 4/1976 Shewchun et al.
5,032,571 A 7/1991 Takemura
6,514,557 B1 2/2003 Finnemore et al.
6,579,360 B1 6/2003 Balachandran et al.
6,797,341 B1 * 9/2004 Zeng et al. ............. 427/585
2002/0132739 A1 9/2002 Kang et al.
2002/0173428 A1 11/2002 Thieme et al.

OTHER PUBLICATIONS

Zeng et al., "In Situ epitaxial MgB2 thin films for superconducting electronics", Letters, Sep. 02, 2002, pp. 1-4.*
Cava et al., "Reactivity of MgB2 with common substrate electronic materials", Applied Physics Letters, vol. 80, No. 2, Jan. 14, 2002.*
Blank et al. "Superconducting Mg-B films by pulsed laser deposition in an situ two-step process using multicomponent targets", Applied Physic Letters, vol. 79, No. 1, Jul. 16, 2001.*
Rointan F. Bunshah et al., "Deposition Technologies for Films and Coatings", Copyright 1982, pp. 83, 122, 126, 127.

(Continued)

*Primary Examiner*—Brian K. Talbot
(74) *Attorney, Agent, or Firm*—McDermott Will & Emery LLP

(57) ABSTRACT

Boride thin films of conducting and superconducting materials are formed on silicon by a process which combines physical vapor deposition with chemical vapor deposition. Embodiments include forming boride films, such as magnesium diboride, on silicon substrates by physically generating magnesium vapor in a deposition chamber and introducing a boron containing precursor into the chamber which combines with the magnesium vapor to form a thin boride film on the silicon substrates.

14 Claims, 2 Drawing Sheets

OTHER PUBLICATIONS

Xianghui Zeng, et al *"In situ* epitaxial $MgB_2$ thin films for superconducting electronics", Nature Materials, vol. 1, Sep. 2002, pp. 1-3.

John Rowell "Magnesium Diboride, Superior thin films", Nature Mateials, vol. 1, Sep., 2002, pp. 5-6.

Li-Kui Liu, et al., "Thermodynamics of the Mg-B system: Implications for the deposition of $MgB_2$ thin films" Applied Physics Letters, vol. 78, No. 23, Jun. 4, 2001, pp. 3678-3680.

Ron Dagani, "Superior Superconducting Films of $MgB_2$", C&EN: Today's Headlines, Sep. 9, 2002, vol. 80, No. 36.

Saito et al., "As-Grown $MgB_2$ Thin Films Deposited on $Al_2O_3$ Substrates With Different Crystal Planes", Institute of Physics Publishing, pp. 1-6.

Saito et al., As Grown $MgB_2$ Thin Films Deposited on $Al_2O_3$ Substrates With Different Crystal Plane, 1 page.

Saito et al., "As-Grown Deposition Of Superconducting $MgB_2$ Thin Films By Multiple-Target Sputtering System", Reprinted from Jpn. J. Appl. Phys. vol. 41 (2002) pp. L127-129.

(Translation of Reference AP filed with the IDS dated Sep. 9, 2002)—Shimakage et al., Low Temperature Fabrication Of As-As-Grown $MgB_2$ Thin Films By Co-Vapor Deposition Method, Communications Research Laboratory Independent Adminsitrative Institution, 2 pages.

Liu et al., "Thermodynamic Reactivity of the Magnesium Vapor With Substrate Materials During $MgB_2$ Deposition", 2003 Elsevier B.V. All rights reserved, doi:10.1016/j.physc.2003.07.006.

T. He et al., "Reactivity of $MgB_2$ With Common Substrate and Electronic Materials", Applied Physics Letters, vol. 80, No. 2, Jan. 14, 2002, pp. 291-293.

Zi-Kui Liu et al., "Computational Thermodynamic Modeling of the Mg-B System", *Calphad*, vol. 25, No. 2, pp. 299-303.

Zeng, Xianghul., et al. "In situ epitaxial $MgB_2$ thin films for superconducting electronics." Nature Materials, vol. 1, Sep. 2002, www.nature.com/naturematerials pp. 1-4.

PCT/IB/326 for International Application No. PCT/US2004/005289 filed Feb. 24, 2004 claiming priority of Feb. 28, 2003.

PCT/IB/273 (Written Opinion) for International Application No. PCT/US2004/005289 filed Feb. 24, 2004 claiming priority of Feb. 28, 2003.

* cited by examiner

BORIDE THIN FILMS ON SILICON

CROSS-REFERENCE TO RELATED APPLICATION

This application claims the benefit of U.S. Provisional Application No. 60/450,321, filed 28 Feb. 2003, which is hereby incorporated herein by reference in its entirety. This application contains subject matter that may be related to U.S. application Ser. No. 10/395,892, filed 25 Mar. 2003 and titled METHOD FOR PRODUCING BORIDE THIN FILMS.

GOVERNMENT INTEREST IN THE INVENTION

The subject matter of this disclosure was made with support from the Government under Contract No. N00014-00-1-0294. The Government may have certain rights in this invention.

FIELD OF THE INVENTION

The present invention relates to thin films for electronics and methods of their formation and, in particular, to boride thin films on silicon for use in superconducting electronics such as superconducting integrated circuits.

BACKGROUND

Integrated circuits using superconductors are more suitable for ultrafast processing of digital information. Niobium (Nb) based superconductor integrated circuits using rapid single flux quantum (RSFQ) logic have demonstrated the potential to operate at clock frequencies beyond 700 GHz. However, the Nb-based circuits must operate at temperatures close to 4.2 Kelvin (K), which requires heavy cryocoolers with several kilowatts of input power, which is not acceptable for most electronic applications. Circuits based on high temperature superconductors (HTS) would advance the field. However, reproducible HTS Josephson junctions with sufficiently small variations in device parameters have proved elusive despite 16 years after the discovery of HTS.

The success in HTS Josephson junctions has been limited due to the lack of an adequate thin film technology. Because superconducting integrated circuits utilize a multilayer structure including superconducting, insulating and resistive films, an in situ process in which the HTS is formed directly on the substrate is desirable.

The newly-discovered superconductor material magnesium diboride ($MgB_2$) holds great promise for superconducting electronics, in part, because of its relatively high transition temperature ($T_c$), at which temperature the respective material becomes superconducting and changes in electrical resistance from a measurable or relatively high value of resistance to a value of zero. This temperature for $MgB_2$, in bulk, can be as high as 39 K. Like the conventional superconductor Nb, $MgB_2$ is a phonon-mediated superconductor with a relatively long coherence length. These properties make the prospect of fabricating reproducible uniform Josephson junctions more favorable for $MgB_2$ than for other high temperature superconductors.

A problem encountered in depositing $MgB_2$ thin films, however, is that sufficient magnesium vapor pressure is necessary to provide for a thermodynamically stable $MgB_2$ phase at elevated temperatures. This problem is complicated when forming boride thin films on substrates containing silicon because of magnesium's propensity to chemically react with silicon at high temperatures. Indeed, previous thermodynamic calculations and investigations indicate that it is not possible to grow magnesium diboride thin films on a silicon substrate (T. He, R. J. Cava and J. M. Rowell, "Reactivity of MgB2 with common substrate and electronic materials", Appl. Phys. Lett., vol. 80, 2002, 291–293). Magnesium's reactivity with silicon and silicon oxides leads to magnesium-silicon and magnesium-silicon-oxide compounds that contaminate the silicon surface and, in extreme situations, prevents usable magnesium boride films on silicon substrates.

Accordingly, a continuing need exists for the efficient manufacture of boride thin films on silicon. It is further desirable to form high purity, super conducting boride films on silicon by an in situ process to facilitate fabrication of semiconductor electronic components.

BRIEF SUMMARY

Advantages of the present invention are boride thin films on silicon and methods for their manufacture.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method which combines physical vapor deposition with chemical vapor deposition. The method comprises introducing or providing a substrate containing silicon, i.e., a substrate typically used in fabricating semiconductors, into a reaction or deposition chamber. The method further includes physically generating vapor from at least one magnesium target, which is within the chamber containing the substrate. The vapor of the target material can be physically generated as by, for example, heating the target material, ablating the target material, or by employing a pulsed laser upon the target material thereby physically generating vapor of the target material in the chamber. Advantageously, the vapor pressure of the magnesium is maintained at a particular range thereby minimizing the formation of magnesium-silicon contaminants, such as magnesium silicides and magnesium silicates. In one aspect, the target material is in close proximity to the substrate, e.g. within several inches, to facilitate formation of the thin film thereon. The target material is in close proximity to the substrate to facilitate formation of the thin film thereon.

The method additionally includes introducing at least one boron containing precursor to the chamber. During the formation of a magnesium boride film, the precursor combines with the vapor from the at least one magnesium target to form a boride thin film of the combined precursor and magnesium on the substrate. Typically, vapor from the magnesium target and the precursor combine by chemical reaction to form a thin film that comprises constituents of the target and constituents of the precursor. However, physical combinations of the two are also contemplated.

Embodiments of practicing the present invention include physically generating vapor from magnesium, or alloys thereof by heating the target material in a reaction chamber; introducing a boron containing precursor, such as borane, to the chamber to combine with the target material; adding or combining a carrier gas, such as hydrogen and/or nitrogen to the precursor; and forming a magnesium boride film on a silicon substrate.

Another aspect of the present invention is a thin magnesium diboride film suitable for use in semiconductor applications. In an embodiment of the present invention, the magnesium diboride film is in direct contact with the surface of a silicon substrate and the interface between the magnesium diboride film and substrate is substantially free of magnesium-silicon compounds, such as magnesium silicides or magnesium silicates.

Additional advantages of the present invention will become readily apparent to those skilled in this art from the following detailed description wherein embodiments of the present invention are described simply by way of illustrated of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

The various features and advantages of the present invention will become more apparent and facilitated by reference to the accompanying drawings, submitted for purposes of illustration and not to limit the scope of the invention, where the same numerals represent like structure and wherein.

DESCRIPTION OF THE INVENTION

Figure 1:
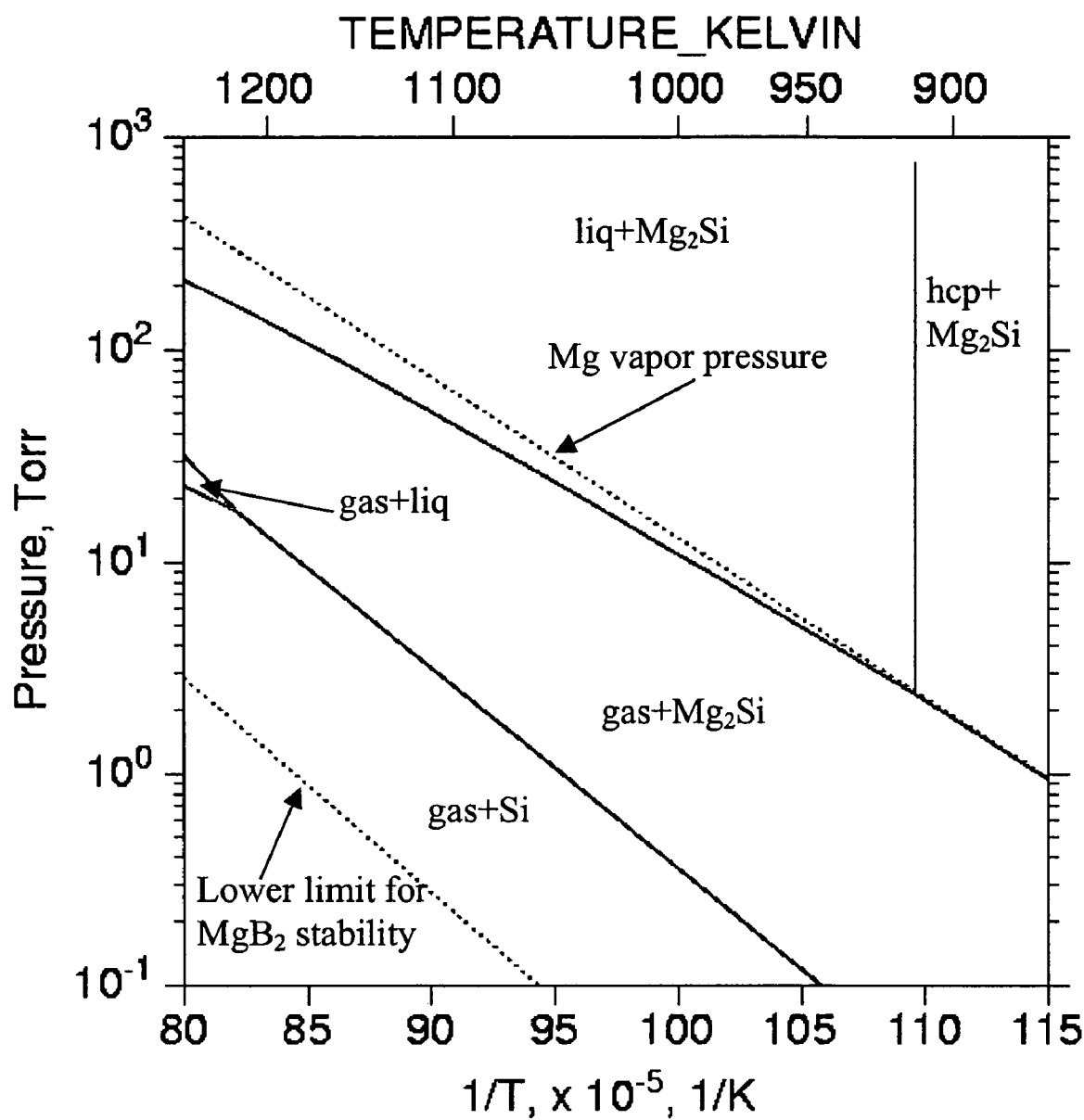
FIG. 1 shows a pressure-temperature phase diagram calculated for depositing a magnesium boride film on a silicon substrate. The region between the two dotted lines indicates the conditions in which magnesium diboride is thermodynamically stable. The region between the "gas+$Mg_2Si$" indicates the conditions in which magnesium reacts with silicon to form $Mg_2Si$, the "gas" component is that of magnesium. The region between the "gas+Si" represents the thermodynamic stability window for the deposition of a magnesium boride film such as $MgB_2$ on a silicon substrate with minimal, if any, Mg—Si compound impurities between the substrate and the grown film.

The present invention contemplates forming thin boron containing films on substrates comprised of silicon by combining, in part, physical vapor deposition (PVD) with chemical vapor deposition (CVD). This hybrid physical chemical vapor deposition (HPCVD) process addresses various problems arising in fabricating thin films of superconducting materials, such as magnesium diboride, which are not readily achieved by either PVD or CVD individually.

A HPCVD system and its use was described in an earlier Application, U.S. patent application Ser. No. 10/395,892 filed 25 Mar. 2003 and entitled "METHOD FOR PRODUCING BORIDE THIN FILMS", the entire disclosure of which is hereby incorporated by reference herein. This application describes, inter alia, forming magnesium boride films on substrates composed of silicon by HPCVD and discloses the thermodynamics of combining magnesium and boron on a silicon substrate.

To better understand the conditions needed for forming thin boride films on silicon, the thermodynamics of the substrate as well as the thermodynamics of the target material and precursor during thin film deposition is helpful. For example, although $MgB_2$ has been known and structurally characterized since the mid 1950's, detailed thermodynamic information is limited. Thermodynamic analysis and calculation of phase diagrams (CALPHAD) can be achieved with known software programs and known methods. See, e.g., Z. K. Liu et al. "Computational Thermodynamic modeling of Mg-B System" CALPHAD 2001:25:299–303; Z. K. Liu et al. "Thermodynamics of the Mg-B system: Implications for the Decomposition of MgB2 thin Films" Appl. Phys. Lett. 2001:78:3678–3680.

In the CALPHAD approach, the Gibbs energies of individual phases in a system are constructed with models primarily based on the crystal structures of the phases. For pure elements, the most commonly used model is that suggested by the Scientific Group Thermodata Europe (SGTE). Using the experimentally-measured enthalpy of formation and estimated decomposition temperatures, the Gibbs energy of each phase is evaluated with, for example, the Thermo-Calc program, which can be obtained commercially through Thermo-Calc Software located in Stockholm, Sweden. The phase equilibria are then calculated and used as guides for determining the optimum conditions for depositing the films.

Previous thermodynamic calculations and experimental investigations have indicated that it was not possible to grow a magnesium diboride film on a silicon substrate due to the reaction between magnesium vapor and silicon. Our new and more detailed calculations, however, have found the existence of a processing window in which thin films of magnesium boride on silicon substrates can be fabricated. Our calculations show that magnesium boride films can be formed on silicon if the vapor pressure of the magnesium is lowered as compared to previous processing pressures.

What may have not been appreciated prior to the present disclosure is the recognition that including the substrate characteristics in the thermodynamic calculations permits a more accurate representation of the processing conditions need to achieve the films. Hence, in one aspect of the present invention, a boron containing thin film is formed on a silicon substrate under the thermodynamic conditions within those shown in FIG. 1.

FIG. 1 represents a Mg—Si phase diagram and indicates conditions where an $MgB_2$ film is thermodynamically stable, i.e., within the two dotted lines. The figure also indicates where magnesium is stably in vapor form, i.e. regions showing "gas", and also where magnesium chemically interacts with silicon, i.e., indicated as "gas+$Mg_2Si$". The region between the "gas+Si" represents the thermodynamic stability window for the deposition of a magnesium boride film on a silicon substrate.

As shown in FIG. 1, the upper and lower limits in which magnesium vapor can be stably in contact with silicon can be calculated. For example, the upper line in the region "gas+Si" can be approximated by $Log(P)=-9549.5/T+9.1$; and the lower line can be approximated by the equation $Log(P)=-10142/T+8.562$, where P represents pressure in units of Torr and T represents temperature in Kelvin (K). Maintaining magnesium vapor pressure at a magnesium partial pressure in a reaction chamber within about the range defined by the above equations, permits magnesium vapor to interact and react with the boron precursor and minimizes, if not completely eliminates, any reaction between magnesium and silicon. By this process, a magnesium boride film can be formed directly on silicon without substantial amounts of magnesium-silicon contaminants between the substrate surface and the magnesium boride film.

Although the foregoing discussion is most applicable to forming a magnesium diboride film on silicon, other boride thin films, can likewise be analyzed and the most optimum processing conditions determined.

Any number of boron containing precursors can be used to produce boron containing thin films. Borides are a family of materials with many different functionalities. These include superconductivity (e.g. $MgB_2$, $T_c$ of about 40K), high conductivity metal (e.g. $TiB_2$, ρ of approximately 10 Ωcm), semiconductor (e.g. $CaB_6$, Eg 0.8 eV), thermoelectric and thermionic materials (e.g. $LaB_6$), magnetic semiconductor (e.g. $CaB_6$ and $SrB_6$), and magnetic superconductor (e.g. $ReRh_4B_4$). The HPCVD technique can be readily applied to the deposition of other boride materials, and for the deposition of heterostructures of borides. Examples of boron containing precursors includes boranes, boron trichloride, boron tribromide, etc.

In one aspect of practicing the present invention, a substrate comprised of silicon is placed in a reaction chamber of an HPCVD system. The substrate can be those that are typically used in the semiconductor industry, but any silicon substrate can potentially be used in this system. Vapor from at least one magnesium target, which is within the chamber with the substrate, is then physically generated. The vapor can be generated by thermally heating the target material, by oblating the target material, or by using a pulse laser to obtain the necessary vapor pressure of the target material. The target material is typically a metal or metal alloy such as magnesium, and alloys thereof. Vapor from the target material is combined with a boron precursor which is introduced to the chamber during physically generating vapor of the target material.

Figure 2:
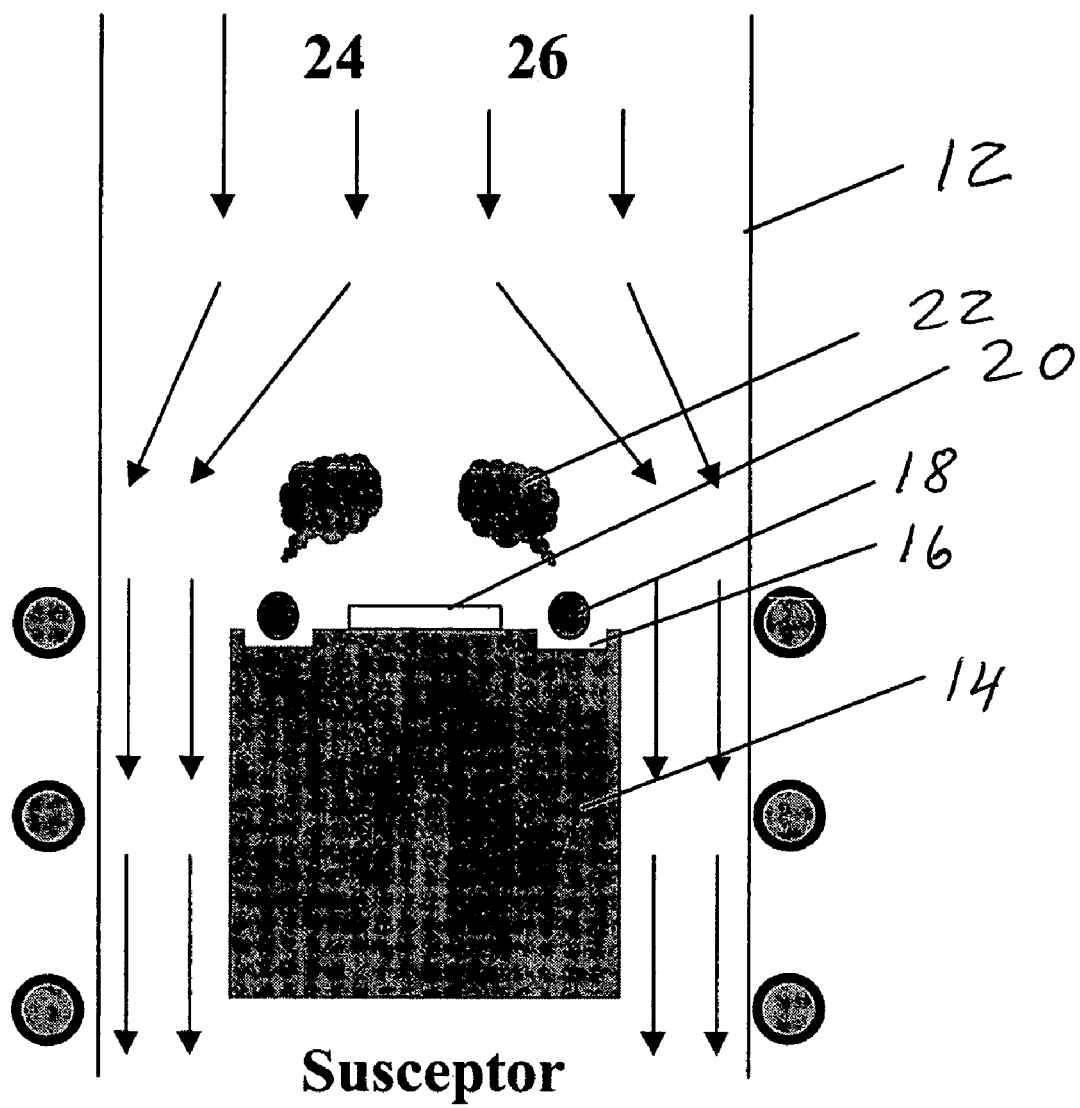
FIG. 2 is a schematic view of an apparatus that can be employed to practice an aspect of the present invention.

In practicing one aspect of the invention, an HPCVD apparatus is described, which can take physical form in certain parts and arrangements of parts. In FIG. 2, an HPCVD system is illustrated. As shown in FIG. 2, system 10 includes a water cooled vertical quartz tube reactor chamber 12. The chamber can be maintained at any appropriate pressure, as determined by a thermodynamic analysis for the applied film. Susceptor 14 is placed coaxially inside chamber 12 as shown. The susceptor can be made from a SiC-coated graphite, Mo, stainless steel or any other suitable material. The Suseptor has retaining groove 16 in which bulk pieces of target material 18 can be placed. In this example, the source material is in the chamber and in close proximity to silicon substrate 20, which is atop suseptor 14. Susceptor 14 can be heated, for example, by an inductance heater (not shown for illustrative convenience). The susceptor can be heated to any appropriate temperature to thermally general vapor of the target material. In one embodiment, the temperature of this susceptor is maintained between about 20° C. to 1200° C., e.g., between about 650–1300 K and preferably between about 900–1100 K.

Heating the suseptor, and/or operating the HPCVD system physically generates vapor 22 of target material 18. In this example the vapor is that from a magnesium source, such as from a high purity magnesium ingot. Carrier gas 24, such as $H_2$, and boron precursor 26, such as borane, can be introduced into chamber 12 simultaneously or individually and at different times from one another and at various flow rates.

Further improvements and flexibility in forming thin films is contemplated by employing different HPCVD configurations. For example, different system configurations would allow independent control over the substrate and target material's temperatures and could be achieved by two independent heater/controllers—one for the substrate and one for the target material. This would increase the range of the growth parameters. Reduced substrate temperatures may also be desirable for the fabrication of multilayer semiconductor structures and junctions where diffusion of components in the semiconductor layers during growth of the thin film at elevated temperature is a concern.

Additionally, films with larger areas and thicknesses can be fabricated reproducibly, and with uniform morphology by varying the distribution of vapor from the target material and precursor. This can be achieved, for example, by varying the position of the target material with respect to the substrate.

As an example, it is expected that a $MgB_2$ film can be formed on a silicon substrate by initially providing a silicon substrate in to a deposition chamber of an HPCVD system and evacuating the chamber. The chamber can be purged prior to and/or after evacuation with an inert gas and/or nitrogen to remove contaminates, such as oxygen. A boron precursor, such as borane, can be bled in to the chamber with or without a carrier gas, such as hydrogen, while a magnesium target source is heated to generate magnesium vapor. The temperature and pressure conditions should be maintained such that the thermodynamics permit growth of the $MgB_2$ film on the silicon substrate with minimal production of magnesium/silicon compounds. As indicated by thermodynamic analysis, a pressure of about 1 to about 10 Torr together with a substrate temperature of around 1000 K while heating a magnesium source to just above its melting point, i.e., above about 900–922 K, would permit the deposition of an $MgB_2$ film on a silicon substrate. Other processing condition can be determined as shown by FIG. 1 and are contemplated by the present invention.

Thin metal boride films on silicon substrates can be used in semiconductor and superconductor electronics. These structures typically include additional conductive, semiconductive and insulating layers to form multilayered structures comprising the metal boride film, such as magnesium diboride, and a substrate comprised of silicon.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of forming a thin film of magnesium boride on a silicon substrate, the method comprising:

introducing a substrate having a surface consisting essentially of silicon into a chamber;

physically generating vapor from at least one source of magnesium, which is within the chamber with the substrate; and introducing at least one boron precursor to the chamber, which combines with the vapor from the at least one source of magnesium to form a thin film of superconductive magnesium boride on the surface consisting essentially of silicon of the substrate, wherein the formed magnesium boride film is substantially free of magnesium-silicon contaminates between the surface consisting essentially of silicon and the magnesium boride film and the pressure of the magnesium vapor is maintained within $Log(P)=-9549.5/T+9.1$; and $Log(P)=-10142/T+8.562$, where P represents pressure in units of Torr and T represents temperature in Kelvin.

2. The method of claim 1, comprising introducing a carrier gas to the chamber prior to, during, or after introducing the boron precursor.

3. The method of claim 2, wherein the carrier gas contains hydrogen and/or nitrogen.

4. The method of claim 1, comprising maintaining a pressure of about 0.1 to about 100 Torr in the chamber during formation of the magnesium boride film on the substrate.

5. The method of claim 1, comprising heating the at least one source of magnesium to a temperature of about 650 K to about 1300 K to physically generate vapor of the at least one source of magnesium.

6. The method of claim 1, comprising maintaining a distance of no less than several inches between the substrate and the at least one source of magnesium while physically generating vapor from the at least one source of magnesium.

7. The method of claim 1, wherein the boron precursor is boron trichloride, boron tribromide, diborane, trimethylboron, boron trifluoride, or any combination thereof.

8. The method of claim 1, comprising maintaining a pressure of about 0.1 Torr to about 30 Torr in the chamber during formation of the magnesium boride film on the substrate.

9. The method of claim 1, comprising physically generating the vapor of the magnesium thermally, or by a pulsed laser.

10. The method of claim 1, comprising physically generating magnesium vapor from the at least one source of magnesium, and introducing a carrier gas to the chamber along with the boron precursor.

11. A method of forming a thin film of magnesium boride on a silicon substrate, the method comprising:

introducing a silicon substrate having a surface consisting essentially of silicon into a chamber;

physically generating magnesium vapor from a magnesium source by heating the magnesium source within the chamber;

introducing diborane to the chamber; and forming a superconductive magnesium diboride thin film directly on the surface consisting essentially of silicon, wherein the pressure of the magnesium vapor is maintained within about $Log(P)=-9549.5/T+9.1$; and $Log(P)=-10142/T+8.562$, where P represents pressure in units of Torr and T represents temperature in Kelvin (K).

12. The method of claim 11, comprising introducing a carrier gas to the chamber prior to, during, or after introducing the boron precursor.

13. The method of claim 12, comprising forming the magnesium diboride thin film directly on the surface consisting essentially of silicon of the substrate, wherein the formed magnesium boride film is substantially free of any non-magnesium diboride compound between the substrate and magnesium diboride film.

14. A method of forming a thin film of magnesium boride on a silicon substrate, the method comprising:

introducing a silicon substrate having a surface consisting essentially of silicon into a chamber;

maintaining magnesium vapor at a magnesium partial pressure within the chamber between about $Log(P)=-9549.5/T+9.1$ and about $Log(P)=-10142/T+8.562$, P represents pressure in units of Torr and T represents temperature in Kelvin; and introducing at least one boron precursor to the chamber to combine with the magnesium vapor to form a thin film of superconductive magnesium boride on the substrate.

* * * * *

UNITED STATES PATENT AND TRADEMARK OFFICE
CERTIFICATE OF CORRECTION

PATENT NO. : 7,090,889 B2 Page 1 of 1
APPLICATION NO. : 10/784899
DATED : August 15, 2006
INVENTOR(S) : Zi-kui Liu et al.

It is certified that error appears in the above-identified patent and that said Letters Patent is hereby corrected as shown below:

Column 1, below "GOVERNMENT INTEREST IN THE INVENTION", change

"The subject matter of this disclosure was made with support from the Government under Contract No. N00014-00-1-0294. The Government may have certain rights in this invention." with the following paragraph:

-- This invention was made with support from the National Science Foundation under Grant No. 9983532 and the Office of Naval Research under Contract No. N00014-00-1-0294. The Government may have certain rights in the invention. --.

Signed and Sealed this

Twenty-sixth Day of December, 2006

JON W. DUDAS
*Director of the United States Patent and Trademark Office*